(12) United States Patent
Kusama

(10) Patent No.: US 12,315,755 B2
(45) Date of Patent: May 27, 2025

(54) SUBSTRATE FIXING DEVICE

(71) Applicant: SHINKO ELECTRIC INDUSTRIES CO., LTD., Nagano (JP)

(72) Inventor: Yasuhiko Kusama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 155 days.

(21) Appl. No.: 18/454,407

(22) Filed: Aug. 23, 2023

(65) Prior Publication Data

US 2024/0071800 A1 Feb. 29, 2024

(30) Foreign Application Priority Data

Aug. 25, 2022 (JP) ................................. 2022-133942

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67103* (2013.01); *H01L 21/67109* (2013.01); *H01L 21/68757* (2013.01)

(58) Field of Classification Search
CPC ........... H01L 21/6833; H01L 21/67103; H01L 21/67109; H01L 21/68757; H01L 21/683; H01L 21/6831
USPC ...................................................... 361/234
See application file for complete search history.

(56) References Cited

U.S. PATENT DOCUMENTS

| | | | | |
|---|---|---|---|---|
| 5,606,485 A * | 2/1997 | Shamouilian | ....... | H01L 21/6833 361/234 |
| 5,636,098 A * | 6/1997 | Salfelder | ............. | H01L 21/6833 361/234 |
| 5,801,915 A * | 9/1998 | Kholodenko | ....... | C23C 16/4586 279/128 |
| 10,535,545 B2 * | 1/2020 | Harayama | ........... | H01L 21/6833 |
| 10,600,669 B2 * | 3/2020 | Shiraiwa | ............. | H01L 21/6831 |
| 10,923,382 B2 * | 2/2021 | Uefuji | ............... | H01L 21/67103 |
| 11,699,612 B2 * | 7/2023 | Takemoto | ......... | H01L 21/68785 361/234 |
| 11,817,339 B2 * | 11/2023 | Hidaka | ................... | C04B 35/64 |

(Continued)

FOREIGN PATENT DOCUMENTS

| | | | | |
|---|---|---|---|---|
| JP | 2020-088304 A | 6/2020 | | |
| WO | WO-2012128348 A1 * | 9/2012 | ........... | H01L 21/683 |
| WO | WO-2019189141 A1 * | 10/2019 | ............... | B23Q 3/15 |

*Primary Examiner* — Dharti H Patel
(74) *Attorney, Agent, or Firm* — Rankin, Hill & Clark LLP

(57) ABSTRACT

A substrate fixing device includes a base plate having a first bonding surface, an electrostatic chuck having a substrate placement surface on which a substrate is placed and a second bonding surface provided on a side opposite to the substrate placement surface, and configured to attract and hold the substrate, and an adhesive layer configured to bond the first bonding surface of the base plate and the second bonding surface of the electrostatic chuck. The electrostatic chuck includes a recess provided in the second bonding surface, an electronic component accommodated in the recess, and a layer having a filling portion configured to fill the recess and a protruding portion protruding from the recess and having a tip end in contact with the first bonding surface.

10 Claims, 12 Drawing Sheets

(56) References Cited

U.S. PATENT DOCUMENTS

| | | | |
|---|---|---|---|
| 2007/0047170 A1* | 3/2007 | Sun | H01L 21/6833 |
| | | | 361/234 |
| 2010/0156055 A1* | 6/2010 | Saito | H01L 21/6831 |
| | | | 279/128 |
| 2013/0148253 A1* | 6/2013 | Komatsu | H01L 21/67103 |
| | | | 361/234 |
| 2020/0176282 A1 | 6/2020 | Iijima et al. | |
| 2023/0312422 A1* | 10/2023 | Chadha | C04B 35/10 |
| | | | 361/234 |

* cited by examiner

SUBSTRATE FIXING DEVICE

CROSS-REFERENCE TO RELATED APPLICATIONS

This application claims priority from Japanese Patent Application No. 2022-133942, filed on Aug. 25, 2022, the entire content of which is incorporated herein by reference.

TECHNICAL FIELD

The present invention relates to a substrate fixing device.

BACKGROUND ART

In the related art, a film forming device or a plasma etching device used for manufacturing a semiconductor device includes a stage for accurately holding a substrate such as a silicon wafer in a vacuum processing chamber. As such a stage, for example, a substrate fixing device has been proposed in which a substrate is attracted and held by an electrostatic chuck mounted on a base plate (for example, see Patent Literature 1).

The substrate fixing device includes a metal base plate, an electrostatic chuck mounted on the base plate, and an adhesive layer bonding the base plate and the electrostatic chuck. The electrostatic chuck includes an electrode for attracting the substrate and a heating element for controlling a temperature of the substrate as an object to be absorbed.

CITATION LIST

Patent Literature

Patent Literature 1: JP2020-88304A

SUMMARY OF INVENTION

Technical Problem

However, in the substrate fixing device described above, a variation in heat generation density may occur on a substrate placement surface of the electrostatic chuck that attracts the substrate. Such variation in heat generation density causes variation in temperature of the substrate. The variation in the temperature of the substrate causes a variation in an etching rate, for example, in a plasma etching device, and thus causes a decrease in the yield of a semiconductor element. Therefore, it is required to improve the uniformity of the temperature on the substrate placement surface of the electrostatic chuck.

Solution to Problem

According to an aspect of the present invention, there is provided a substrate fixing device including a base plate having a first bonding surface, an electrostatic chuck having a substrate placement surface on which a substrate is placed and a second bonding surface provided on a side opposite to the substrate placement surface, and configured to attract and hold the substrate, and an adhesive layer configured to bond the first bonding surface of the base plate and the second bonding surface of the electrostatic chuck. The electrostatic chuck includes a recess provided in the second bonding surface, an electronic component accommodated in the recess, and a layer including a filling portion configured to fill the recess, and a protruding portion protruding from the recess and having a tip end in contact with the first bonding surface.

Advantageous Effects of Invention

According to the aspect of the present invention, it is possible to improve the uniformity of the temperature on the substrate placement surface.

DESCRIPTION OF EMBODIMENTS

Hereinafter, an embodiment will be described with reference to the accompanying drawings.

In the accompanying drawings, for the sake of convenience, a characteristic portion may be enlarged to facilitate understanding of the characteristic, and a dimensional ratio of each component may be different among the drawings. In addition, in a cross-sectional view, in order to facilitate understanding of a cross-sectional structure of each member, hatching of some members is shown in place of a satin pattern, and hatching of some members is omitted.

Overall Configuration of Substrate Fixing Device 10

Figure 1:
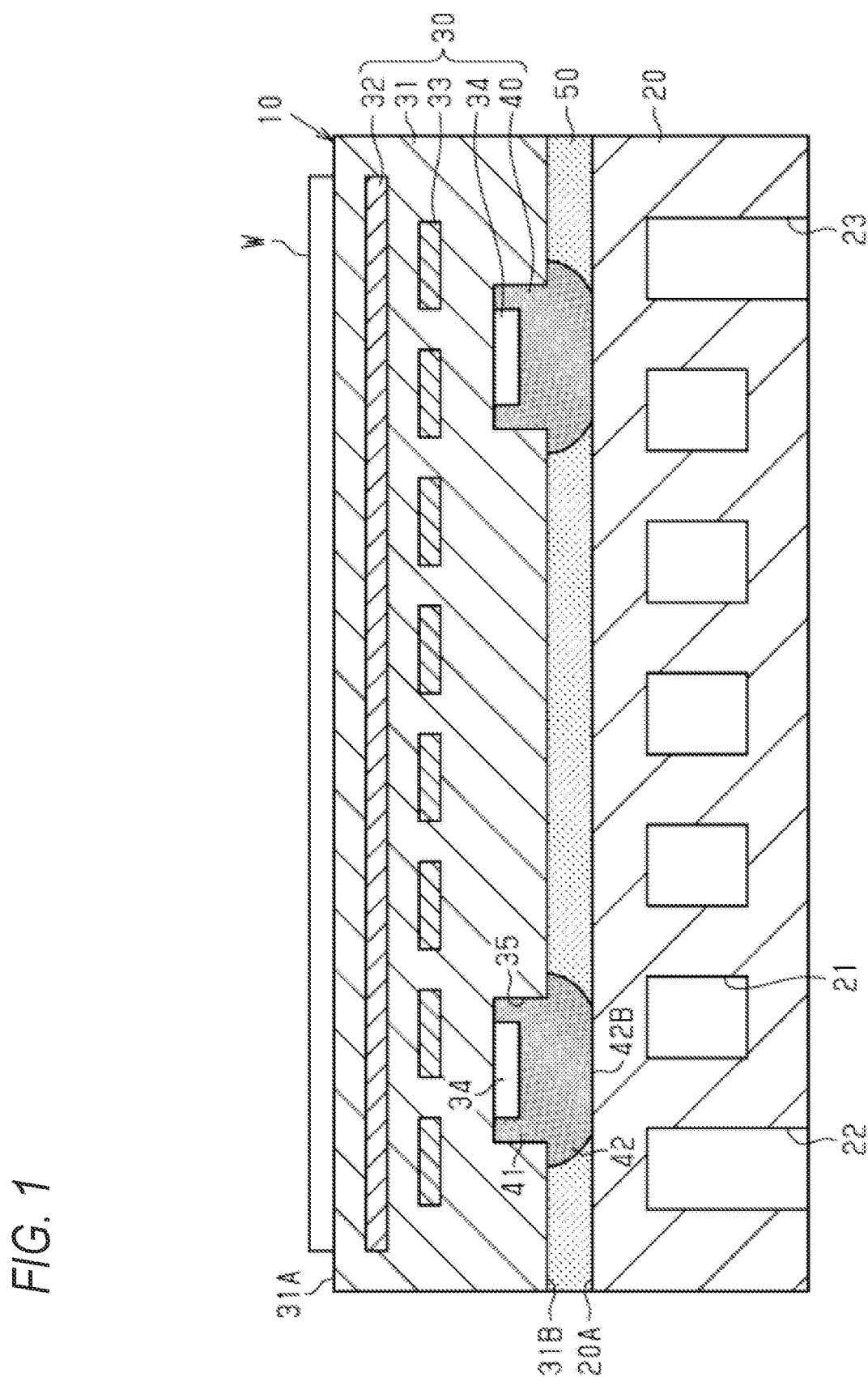
FIG. 1 is a schematic cross-sectional view showing a substrate fixing device according to an embodiment.

As shown in FIG. 1, the substrate fixing device 10 includes a base plate 20, an electrostatic chuck 30, and an adhesive layer 50. The base plate 20 is a base member for mounting the electrostatic chuck 30. The electrostatic chuck 30 is a portion that attracts and holds a substrate W as an object to be attracted. The electrostatic chuck 30 is, for example, a temperature adjustment device that adjusts a temperature of the substrate W. The substrate W is, for example, a silicon wafer.

Configuration of Base Plate 20

The base plate 20 is formed in a circular plate shape, for example. A planar shape of the base plate 20 may be, for example, circular. A diameter of the base plate 20 may be, for example, about 200 mm to 300 mm. A thickness of the base plate 20 may be, for example, about 20 mm to 50 mm. Here, in the description of the present invention, the term "planar shape" means a shape of a subject seen from a normal direction to a substrate placement surface 31A (here, an upper surface) on which the substrate W is placed.

As a material of the base plate 20, for example, a metal material such as aluminum or a super hard alloy, a composite material of the metal material and a ceramic material, or the like can be used. The base plate 20 may be used as, for example, an electrode for controlling plasma. For example, by supplying a predetermined high-frequency power to the base plate 20, it is possible to effectively perform the etching processing by controlling energy for causing generated ions or the like in a plasma state to collide with the substrate W attracted on the electrostatic chuck 30.

The base plate 20 has a first bonding surface 20A (here, an upper surface). The first bonding surface 20A is a surface to be bonded to the adhesive layer 50. The first bonding surface 20A faces the electrostatic chuck 30. Here, "face" in this specification includes both a case where a member different from two portions is interposed between the two portions and a case where nothing is interposed between the two portions.

For example, a cooling path 21 is provided inside the base plate 20. The cooling path 21 includes an introduction portion 22 provided at one end and a discharge portion 23 provided at the other end. The cooling path 21 is connected to, for example, a cooling medium control device (not shown) provided outside the substrate fixing device 10. The cooling medium control device introduces a cooling medium from the introduction portion 22 into the cooling path 21 and discharges the cooling medium from the discharge portion 23. By circulating the cooling medium through the cooling path 21 to cool the base plate 20, the substrate W attracted on the electrostatic chuck 30 can be cooled. As the cooling medium, for example, water or Galden can be used. In addition to the cooling path 21, a gas path or the like for introducing an inert gas for cooling the substrate W attracted on the electrostatic chuck 30 may be provided in the base plate 20.

Configuration of Electrostatic Chuck 30

The electrostatic chuck 30 has, for example, a circular plate shape. A planar shape of the electrostatic chuck 30 may be, for example, a circular shape. A diameter of the electrostatic chuck 30 may be, for example, equal to or larger than the diameter of the base plate 20. The diameter of the electrostatic chuck 30 of the present embodiment is equal to the diameter of the base plate 20. The diameter of the electrostatic chuck 30 may be, for example, about 200 mm to 300 mm. A thickness of the electrostatic chuck 30 may be, for example, about 1 mm to 10 mm.

The electrostatic chuck 30 includes, for example, a substrate main body (base body) 31, an electrostatic electrode 32 (electrode) and heating elements 33 built in the substrate main body 31, electronic components 34 built in the substrate main body 31, and resin layers (layer) 40. The electrostatic chuck 30 is, for example, a Johnsen-Rahbek type electrostatic chuck. The electrostatic chuck 30 may be a Coulomb force type electrostatic chuck.

The substrate main body 31 has a substrate placement surface 31A (here, an upper surface) on which the substrate W is placed, and a second bonding surface 31B (here, a lower surface) provided on a side opposite to the substrate placement surface 31A. The substrate placement surface 31A and the second bonding surface 31B are provided on opposite sides to each other in a thickness direction (upper-lower direction in the drawing) of the substrate main body 31. For example, the substrate placement surface 31A and the second bonding surface 31B are formed parallel to each other.

As a material of the substrate main body 31, for example, an insulating material can be used. For example, ceramics such as alumina, aluminum nitride, and silicon nitride, and organic materials such as silicone resin and polyimide resin can be used as the material of the substrate main body 31. In the present embodiment, ceramics such as alumina or aluminum nitride is used as the material of the substrate main body 31 in terms of ease of availability, ease of processing, and relatively high resistance to plasma or the like. In particular, when aluminum nitride is used as the material of the substrate main body 31, a thermal conductivity thereof is as large as about 15 W/mK to 250 W/mK, which is preferable for reducing a temperature difference in the plane of the substrate W attracted to the electrostatic chuck 30.

A plurality of recesses 35 are provided in the second bonding surface 31B of the substrate main body 31. Each of the recesses 35 is formed to be recessed from the second bonding surface 31B toward the substrate placement surface 31A. A depth of each recess 35 may be, for example, about 800 μm to 1000 μm. A planar shape of each recess 35 may be any shape and any size. The planar shape of each recess 35 may be, for example, a circular shape or an elliptical shape.

The electrostatic electrode 32 is an electrode for attracting the substrate W. The electrostatic electrode 32 is an electrode formed in a thin film shape. The electrostatic electrode 32 is built in the substrate main body 31. The electrostatic electrode 32 is built, for example, in a portion positioned in the vicinity of the substrate placement surface 31A in the thickness direction of the substrate main body 31. The electrostatic electrode 32 is disposed, for example, on a plane parallel to the substrate placement surface 31A. The electrostatic electrode 32 is electrically connected to a power supply for adsorption (not shown) provided outside the substrate fixing device 10. When a predetermined voltage is applied to the electrostatic electrode 32 from the power supply for adsorption, the electrostatic electrode 32 generates an adsorption force by electrostatic electricity between the electrostatic electrode 32 and the substrate W placed on the substrate placement surface 31A. Accordingly, the substrate W can be attracted and held on the substrate placement surface 31A. An adsorption and holding force of the electrostatic chuck 30 increases as the voltage applied to the electrostatic electrode 32 increases. The electrostatic electrode 32 may have a unipolar shape or a bipolar shape. As the material of the electrostatic electrode 32, for example, tungsten (W) or molybdenum (Mo) can be used. In each of the drawings, one electrostatic electrode 32 is shown, but actually, a plurality of electrodes arranged on the same plane are included.

The plurality of heating elements 33 are for heating the substrate W. The plurality of heating elements 33 are built in the substrate main body 31. The plurality of heating elements 33 are built, for example, between the electrostatic electrode 32 and the second bonding surface 31B in the thickness direction of the substrate main body 31. The plurality of heating elements 33 are disposed, for example, on a plane parallel to the substrate placement surface 31A. Each heating element 33 is electrically insulated from the electrostatic electrode 32. As the material of the heating element 33, for example, copper (Cu), tungsten, nickel (Ni), and constantan (Cu/Ni/Mn/Fe alloy) can be used. The thickness of the heating element 33 may be, for example, about 20 μm to 100 μm. The plurality of heating elements 33 may have, for example, a concentric circular pattern.

The plurality of heating elements 33 are electrically connected to a power supply for heating (not shown) provided outside the substrate fixing device 10. The plurality of heating elements 33 generate heat according to a voltage applied from the power supply for heating. The plurality of heating elements 33 heat the substrate placement surface 31A of the substrate main body 31 to a predetermined temperature. For example, the heating element 33 can heat the substrate placement surface 31A to a temperature of about 250° C. to 300° C.

The electronic component 34 is accommodated in the recess 35. The electronic component 34 is provided on a bottom surface of the recess 35. The electronic component 34 is electrically connected to, for example, the electrostatic electrode 32 or the heating element 33. The electronic component 34 is, for example, an electronic component used for controlling the temperature of the substrate placement surface 31A. As the electronic component 34, for example, a diode, a capacitor, a thermistor, or the like can be used.

Configuration of Resin Layer 40

The resin layers 40 are respectively formed, for example, to seal the electronic components 34 accommodated in the recesses 35. As a material of the resin layer 40, for example, silicone resin, epoxy resin, or the like can be used. As the material of the resin layer (layer) 40, for example, ceramics such as alumina or aluminum nitride may be used.

Figure 2:
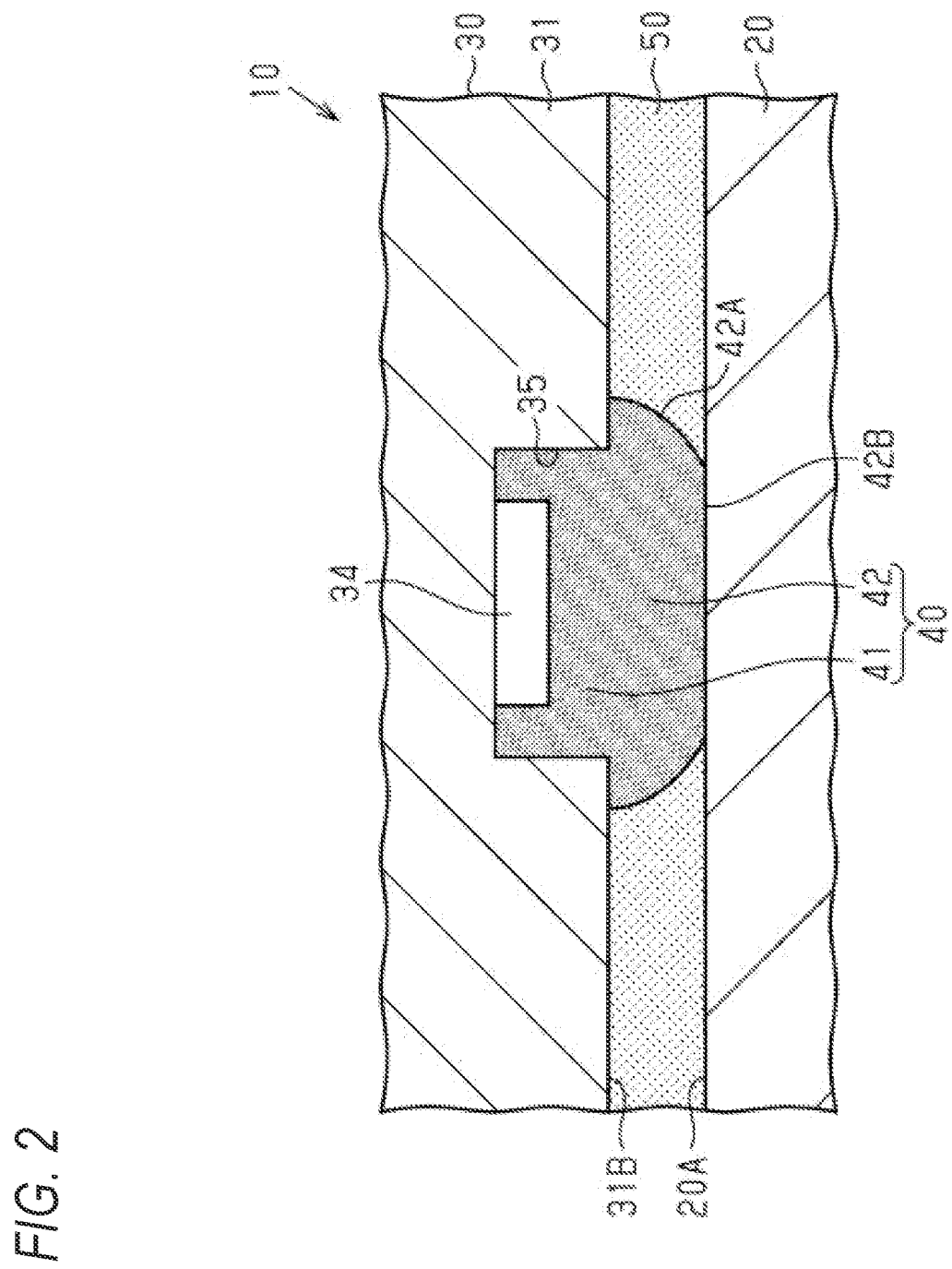
FIG. 2 is a schematic cross-sectional view showing a part of the substrate fixing device according to the embodiment.

As shown in FIG. 2, each of the resin layers 40 includes a filling portion 41 that fills the recess 35, and a protruding portion 42 that protrudes from the recess 35 and has a tip end in contact with the first bonding surface 20A of the base plate 20. In each resin layer 40, the filling portion 41 and the protruding portion 42 are continuously and integrally formed. Each resin layer 40 is, for example, a single layer. Here, in each resin layer 40, the filling portion 41 and the protruding portion 42 may be formed as separate bodies.

The filling portion 41 is formed so as to cover the entire electronic component 34. The filling portion 41 has, for example, a function of protecting the electronic component 34 accommodated in the recess 35 and a function of fixing the electronic component 34 in the recess 35. The filling portion 41 is formed so as to cover the entire side surface of the electronic component 34, for example. The filling portion 41 is formed so as to cover the entire lower surface of the electronic component 34. The filling portion 41 is formed so as to cover the entire surface of the recess 35 exposed from the electronic component 34, for example. The filling portion 41 is formed so as to cover the entire bottom surface of the recess 35 exposed from the electronic component 34, for example. The filling portion 41 is formed so as to cover the entire inner side surface of the recess 35, for example. Although not shown, the electronic component 34 has an electrode on an upper surface thereof, for example.

The protruding portion 42 protrudes from the second bonding surface 31B toward the first bonding surface 20A of the base plate 20. The protruding portion 42 is formed in a columnar shape protruding downward from the second bonding surface 31B. The protruding portion 42 extends from the second bonding surface 31B to the first bonding surface 20A of the base plate 20. The tip end of the protruding portion 42 is in contact with the first bonding surface 20A of the base plate 20. The protruding portion 42 is formed larger than a planar shape of the filling portion 41, for example. A planar shape of the protruding portion 42 is, for example, slightly larger than the planar shape of the filling portion 41. The protruding portion 42 is formed so as to spread outward from the filling portion 41, for example. The protruding portion 42 is formed so as to cover the second bonding surface 31B located at a peripheral edge of the recess 35. The planar shape of the protruding portion 42 may be any shape and any size. The planar shape of the protruding portion 42 may be, for example, the same as the planar shape of the recess 35. The planar shape of the protruding portion 42 may be, for example, a circular shape or an elliptical shape.

The protruding portion 42 has, for example, a side surface 42A and a tip end surface 42B provided at the tip end of the protruding portion 42. The protruding portion 42 is formed in, for example, a hemispherical shape or a semi-elliptical spherical shape as a whole. The side surface 42A of the protruding portion 42 is formed as a curved surface curved in an arc shape, for example. The side surface 42A of the protruding portion 42 is formed as a convex curved surface, for example. For example, the side surface 42A of the protruding portion 42 is formed to be curved so as to approach a plane center of the protruding portion 42 from the second bonding surface 31B toward the first bonding surface 20A.

The tip end surface 42B of the protruding portion 42 is formed in a flat surface, for example. The tip end surface 42B of the protruding portion 42 is formed so as to extend parallel to the second bonding surface 31B, for example. The tip end surface 42B of the protruding portion 42 is formed, for example, so as to spread parallel to the first bonding surface 20A. The protruding portion 42 is provided such that the entire tip end surface 42B is in contact with the first bonding surface 20A.

The tip end surface 42B of the protruding portion 42 is, for example, a smooth surface with less unevenness. The tip end surface 42B of the protruding portion 42 is, for example, a polished surface. The tip end surface 42B of the protruding portion 42 is, for example, smaller in surface roughness than the side surface 42A of the protruding portion 42. The planar shape of the tip end surface 42B may be, for example, the same as the planar shape of the recess 35. The planar shape of the tip end surface 42B may be, for example, a circular shape or an elliptical shape.

A thickness of the protruding portion 42, that is, a thickness from the second bonding surface 31B to the tip end surface 42B is set according to a design value (target value) of a thickness of the adhesive layer 50. The thickness of the protruding portion 42 is set to be equal to a design value of the thickness of the adhesive layer 50. The protruding portion 42 functions as a convex structure for controlling the thickness of the adhesive layer 50 to a desired thickness. The protruding portion 42 functions as a support column that supports the base plate 20 on the electrostatic chuck 30, for example. The protruding portion 42 functions as, for example, a spacer for maintaining a gap between the second bonding surface 31B and the first bonding surface 20A at a desired thickness. The thickness of the protruding portion 42 may be, for example, about 50 μm to 2000 μm.

As shown in FIG. 1, the plurality of protruding portions 42 are formed to have the same thickness. Therefore, each of the plurality of protruding portions 42 is formed such that the tip end surface 42B is in contact with the first bonding surface 20A of the base plate 20.

Figure 3:
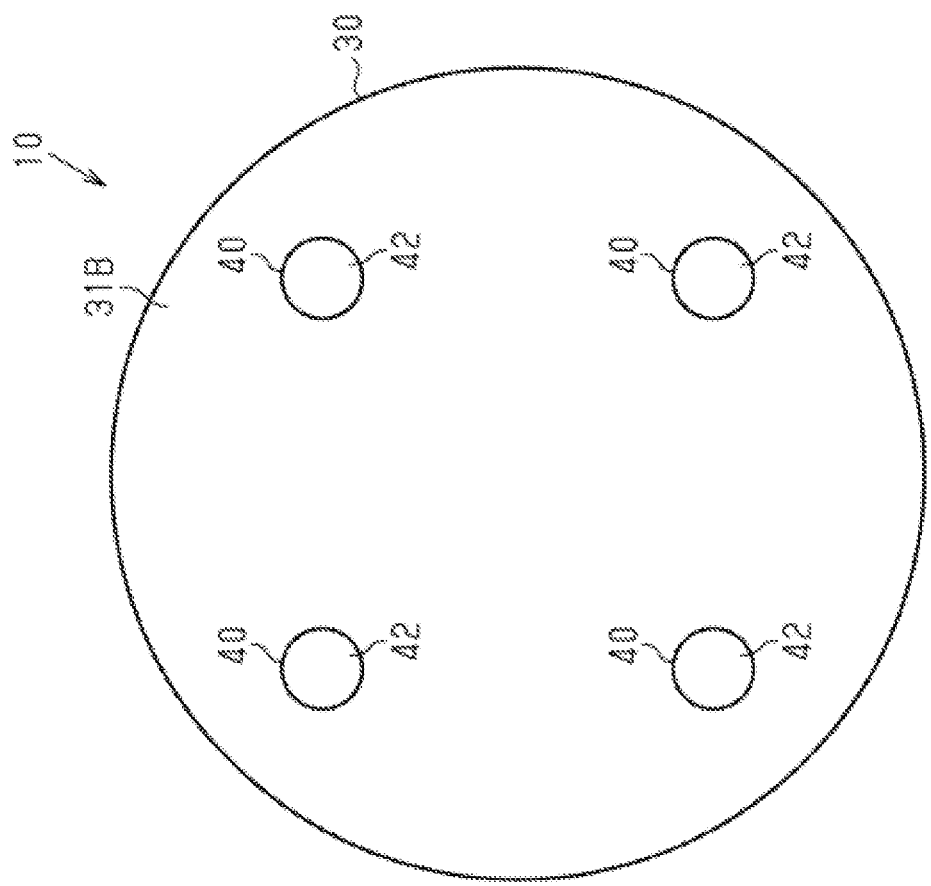
FIG. 3 is a schematic plan view showing a part of the substrate fixing device according to the embodiment.

As shown in FIG. 3, for example, the plurality of protruding portions 42 are provided apart from each other in a plan view. For example, the plurality of protruding portions 42 are dispersedly provided on the second bonding surface 31B. The plurality of protruding portions 42 are provided at at least three points which are not on the same straight line in a plane perpendicular to the thickness direction of the substrate fixing device 10, for example. The plurality of protruding portions 42 are provided, for example, in four directions of the second bonding surface 31B in a dispersed manner. FIG. 3 is a plan view of the substrate fixing device 10 as viewed from below, in which the base plate 20 and the adhesive layer 50 are shown in a see-through manner.

As shown in FIG. 1, the plurality of protruding portions 42 are provided, for example, so as to be able to support the base plate 20 on the electrostatic chuck 30 such that the second bonding surface 31B of the electrostatic chuck 30 is not inclined with respect to the first bonding surface 20A of the base plate 20. By providing such a protruding portion 42, it is possible to improve in-plane uniformity of the thickness of the adhesive layer 50.

Configuration of Adhesive Layer 50

The adhesive layer 50 bonds the electrostatic chuck 30 onto the base plate 20. The adhesive layer 50 conducts heat of the electrostatic chuck 30 to the base plate 20, for example. That is, the adhesive layer 50 functions as an adhesive for bonding the base plate 20 and the electrostatic chuck 30, and also functions as a heat conductive member. As the material of the adhesive layer 50, for example, a material having a high thermal conductivity can be used. A silicone-based adhesive can be used as the material of the adhesive layer 50. The adhesive layer 50 may be formed in one layer, or may be formed in a laminated structure in which a plurality of adhesive layers are laminated. For example, when the adhesive layer 50 has a two-layer structure in which an adhesive having a high thermal conductivity and an adhesive having a low elastic modulus are combined, an effect of reducing stress caused by a difference in thermal expansion from the base plate 20 made of aluminum is obtained.

The thickness of the adhesive layer 50 is equal to the thickness of the protruding portion 42. The thickness of the adhesive layer 50 may be, for example, about 50 μm to 2000 μm. The adhesive layer 50 is formed, for example, so as to fill a gap between the electrostatic chuck 30 and the base plate 20, which is defined by the protruding portion 42. The adhesive layer 50 is formed, for example, so as to cover the entire side surface 42A of the protruding portion 42.

Method for Manufacturing Substrate Fixing Device 10

Next, a method for manufacturing the substrate fixing device 10 will be described.

Figure 4:
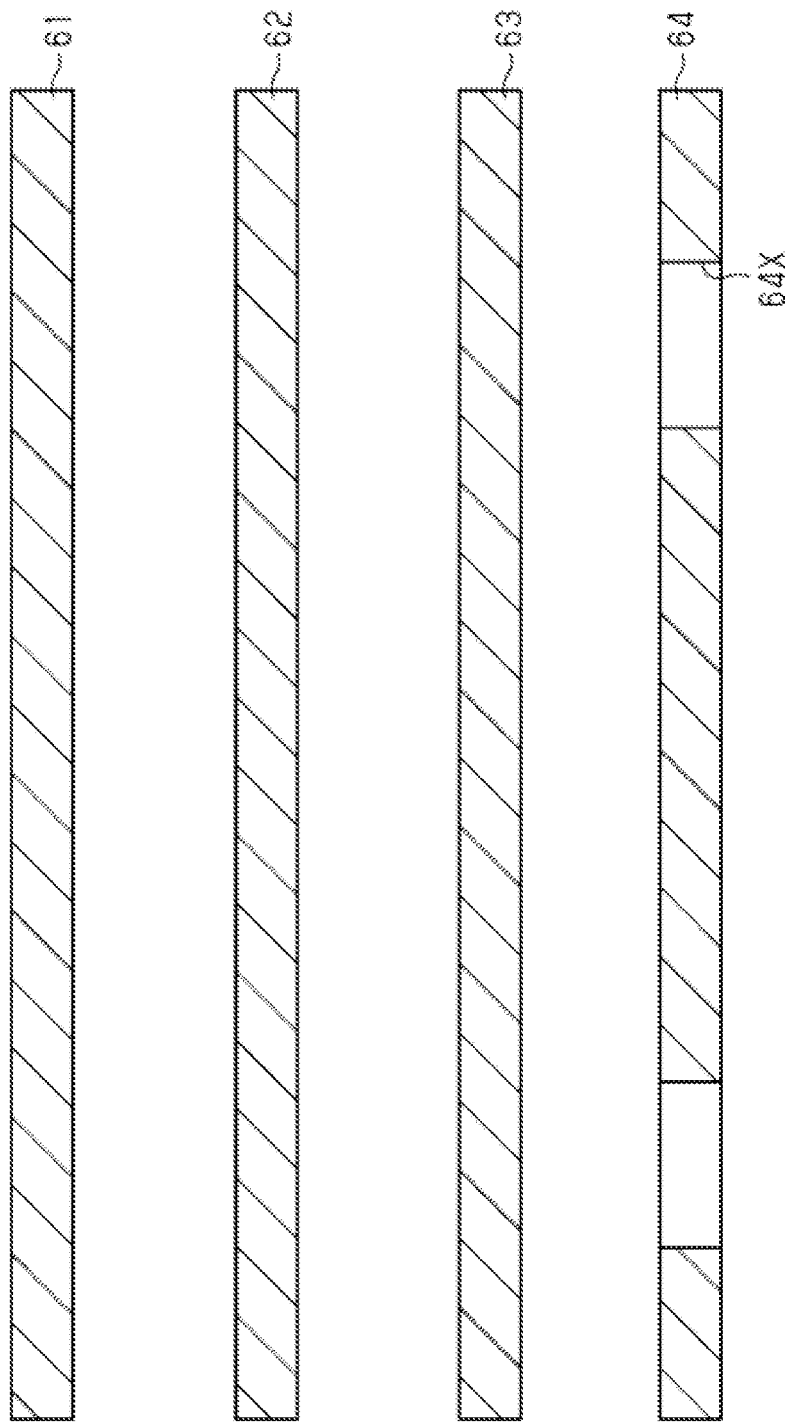
FIG. 4 is a schematic cross-sectional view showing a method for manufacturing a substrate fixing device according to the embodiment.

First, in a step shown in FIG. 4, green sheets 61, 62, 63, and 64 made of a ceramic material and an organic material are prepared. Each of the green sheets 61, 62, 63, and 64 is, for example, a sheet obtained by mixing alumina with a binder, a solvent, or the like. The size of a planar shape of each of the green sheets 61, 62, 63, and 64 corresponds to the size of the planar shape of the electrostatic chuck 30 shown in FIG. 1.

The green sheet 61 serves as a portion of the substrate main body 31 on which the substrate W shown in FIG. 1 is mounted by being fired in a step to be described later. The green sheet 62 is used to form the electrostatic electrode 32 shown in FIG. 1 by being fired in a step to be described later, and serves as a portion of the substrate main body 31 between the electrostatic electrode 32 and the heating element 33. The green sheet 63 is used to form the heating element 33 shown in FIG. 1 by being fired in a step to be described later, and serves as a portion of the substrate main body 31 between the heating element 33 and the recess 35. The green sheet 64 serves as a portion of the substrate main body 31 to be bonded to the adhesive layer 50 by being fired in a step to be described later. The green sheet 64 is provided with through holes 64X penetrating the green sheet 64 in the thickness direction. The through hole 64X is provided at a position corresponding to the recess 35 shown in FIG. 1. A size of a planar shape of the through hole 64X is set according to the size of the planar shape of the recess 35 shown in FIG. 1. The through hole 64X is formed by, for example, a laser processing method or a machining method.

Figure 5:
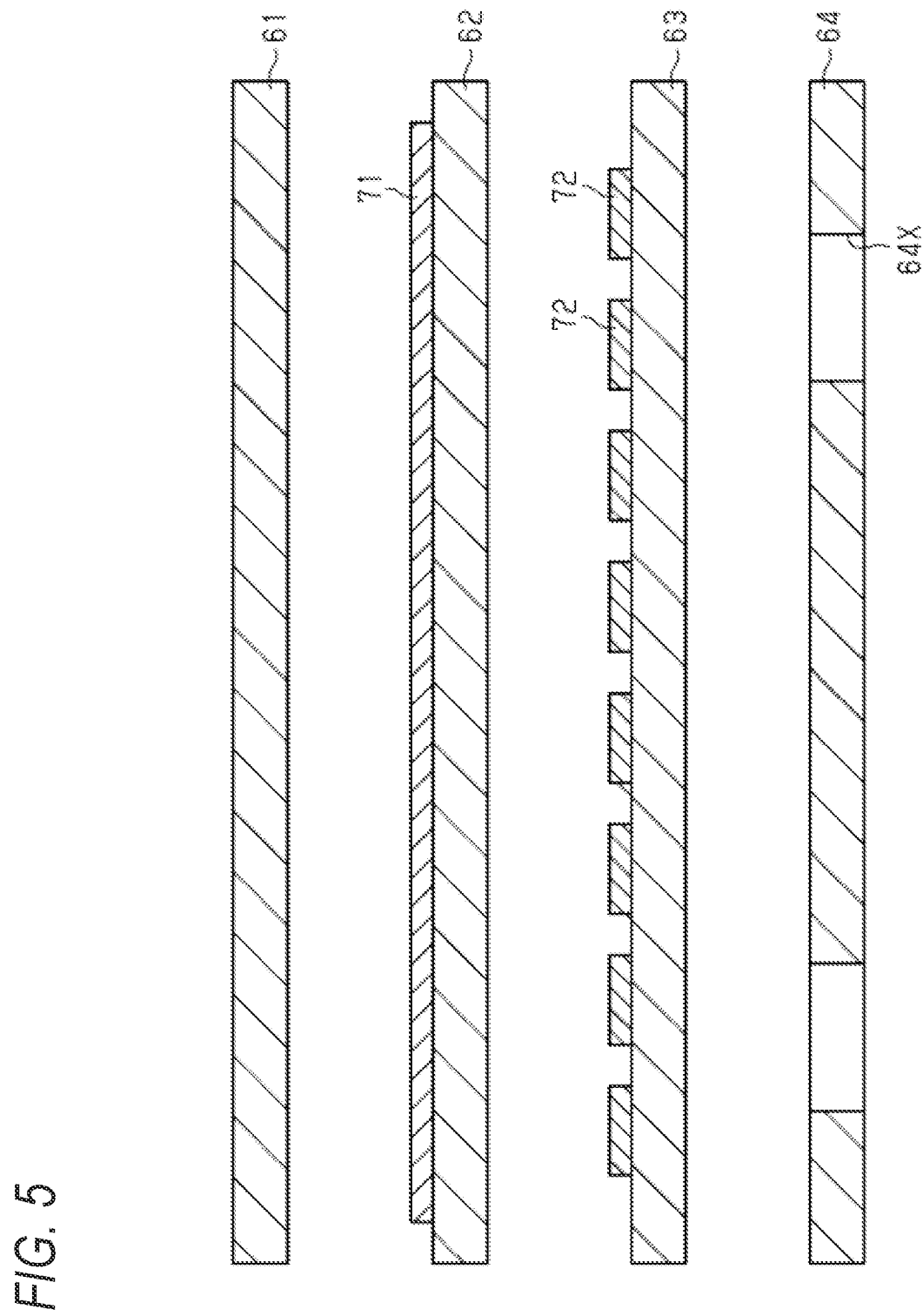
FIG. 5 is a schematic cross-sectional view showing the method for manufacturing a substrate fixing device according to the embodiment.

Next, in a step shown in FIG. 5, a wiring pattern 71 is formed on an upper surface of the green sheet 62 using a conductive paste (for example, tungsten paste) by, for example, a printing method (screen printing). The wiring pattern 71 serves the electrostatic electrode 32 shown in FIG. 1 by being fired in a step to be described later. The conductive paste may include metal particles of molybdenum or the like or conductive ceramic particles, a binder, and a solvent. The wiring pattern 71 may be formed on a lower surface of the green sheet 61.

In the step shown in FIG. 5, conductive patterns 72 are formed on an upper surface of the green sheet 63 by using a conductive paste (for example, tungsten paste) by, for example, a printing method (screen printing). The conductive pattern 72 serves as the heating element 33 shown in FIG. 1 by being fired in a step to be described later. The conductive paste may include metal particles of molybdenum or the like or conductive ceramic particles, a binder, and a solvent. The conductive pattern 72 may be formed on a lower surface of the green sheet 62.

Subsequently, in a step shown in FIG. 6, the green sheet 63 in a state in which the surface on which the conductive pattern 72 is formed faces up, the green sheet 62 in a state in which the surface on which the wiring pattern 71 is formed faces up, and the green sheet 61 are sequentially laminated on the green sheet 64. The green sheets 61, 62, 63, and 64 are bonded to each other by, for example, applying a pressure while being heated. In this step, openings above the through holes 64X of the green sheet 64 are closed by the green sheet 63.

Figure 6:
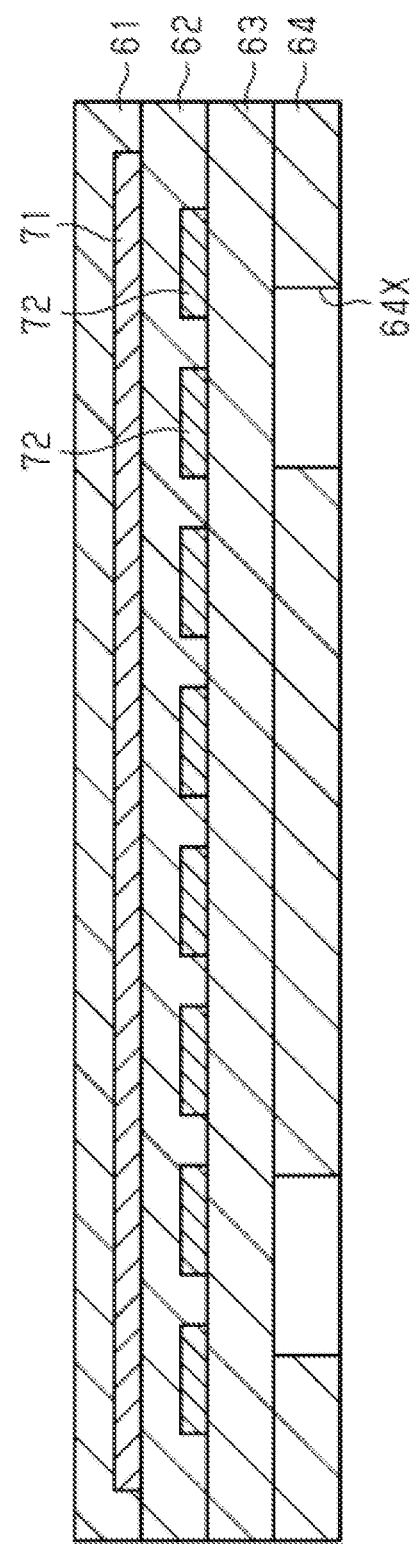
FIG. 6 is a schematic cross-sectional view showing the method for manufacturing a substrate fixing device according to the embodiment.
Figure 7:
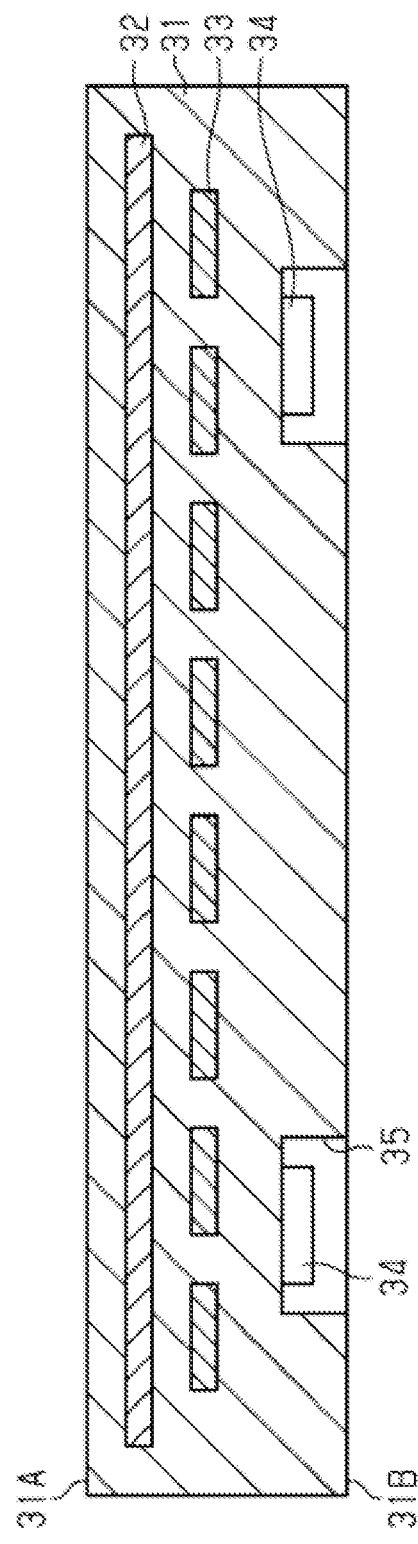
FIG. 7 is a schematic cross-sectional view showing the method for manufacturing a substrate fixing device according to the embodiment.

Next, in a step shown in FIG. 7, the structure shown in FIG. 6 is fired. Accordingly, the green sheets 61, 62, 63, and 64 shown in FIG. 6 are sintered to obtain the substrate main body 31. A firing temperature is, for example, 1500° C. to 1600° C. The substrate main body 31 includes the electrostatic electrode 32 obtained by sintering the wiring pattern 71 shown in FIG. 6, and includes the heating elements 33 obtained by sintering the conductive patterns 72 shown in FIG. 6.

Next, both upper and lower surfaces of the substrate main body 31 are polished. Accordingly, the upper surface of the substrate main body 31 is formed as the substrate placement surface 31A, and the lower surface of the substrate main body 31 is formed as the second bonding surface 31B. The polished substrate main body 31 includes the plurality of recesses 35 in the second bonding surface 31B.

Subsequently, the electronic component 34 is mounted on the bottom surface of the recess 35. For example, an electrode of the electronic component 34 is bonded to an electrode pad (not shown) exposed on the bottom surface of the recess 35. The electrode pad exposed on the bottom surface of the recess 35 is electrically connected to, for example, the electrostatic electrode 32 or the heating element 33.

Figure 8:
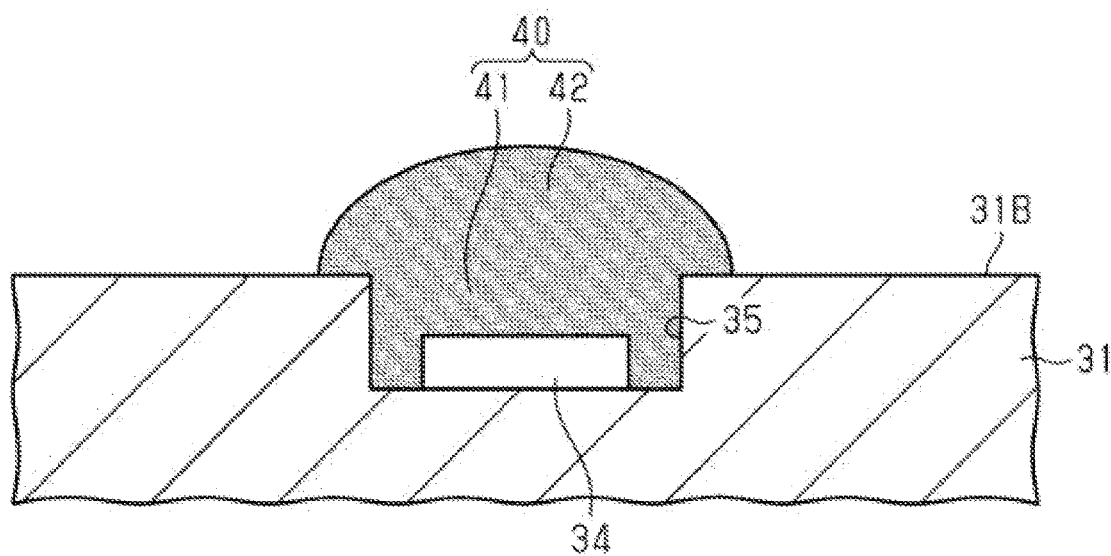
FIG. 8 is a schematic cross-sectional view showing the method for manufacturing a substrate fixing device according to the embodiment.

Next, in a step shown in FIG. 8, the resin layer 40 filling the recess 35 is formed. The resin layer 40 is formed to include the filling portion 41 that fills the recess 35 and the protruding portion 42 that protrudes from the recess 35. At this time, the protruding portion 42 is formed in, for example, a hemispherical shape or a semi-elliptical spherical shape. The tip end of the protruding portion 42 in this step is formed into the curved surface curved in an arc shape. The resin layer 40 can be formed, for example, by applying a liquid insulating resin into the recess 35 by potting and then curing the insulating resin by heating. Note that the structure shown in FIG. 8 is shown upside down from that in FIG. 7.

Figure 9:
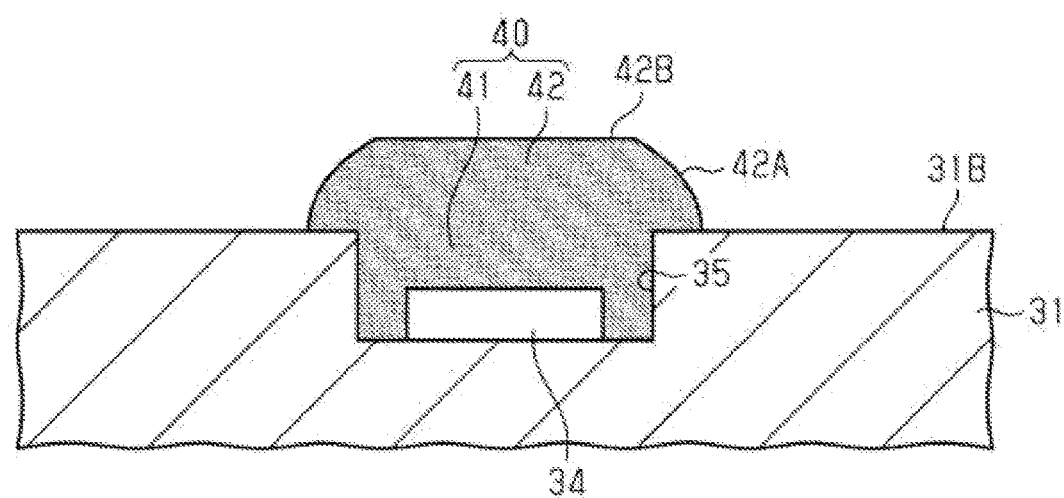
FIG. 9 is a schematic cross-sectional view showing the method for manufacturing a substrate fixing device according to the embodiment.

Next, in a step shown in FIG. 9, the tip end (upper end in FIG. 9) of the protruding portion 42 is polished until the thickness of the protruding portion 42 reaches as the desired thickness. For example, the tip end of the protruding portion 42 is polished until the thickness of the protruding portion 42 reaches the design value of the thickness of the adhesive layer 50 shown in FIG. 1. Accordingly, the thicknesses of the plurality of protruding portions 42 can be made equal to each other. For example, even when the thicknesses of the plurality of protruding portions 42 vary in the step shown in FIG. 8, the thicknesses of the plurality of protruding portions 42 can be made uniform by the polishing in this step. In addition, by the polishing in this step, the flat tip end surface 42B serving as a polished surface is formed at the tip end of the protruding portion 42. The polishing of the protruding portion 42 can be performed by, for example, mechanical polishing or chemical mechanical polishing (CMP).

Figure 10:
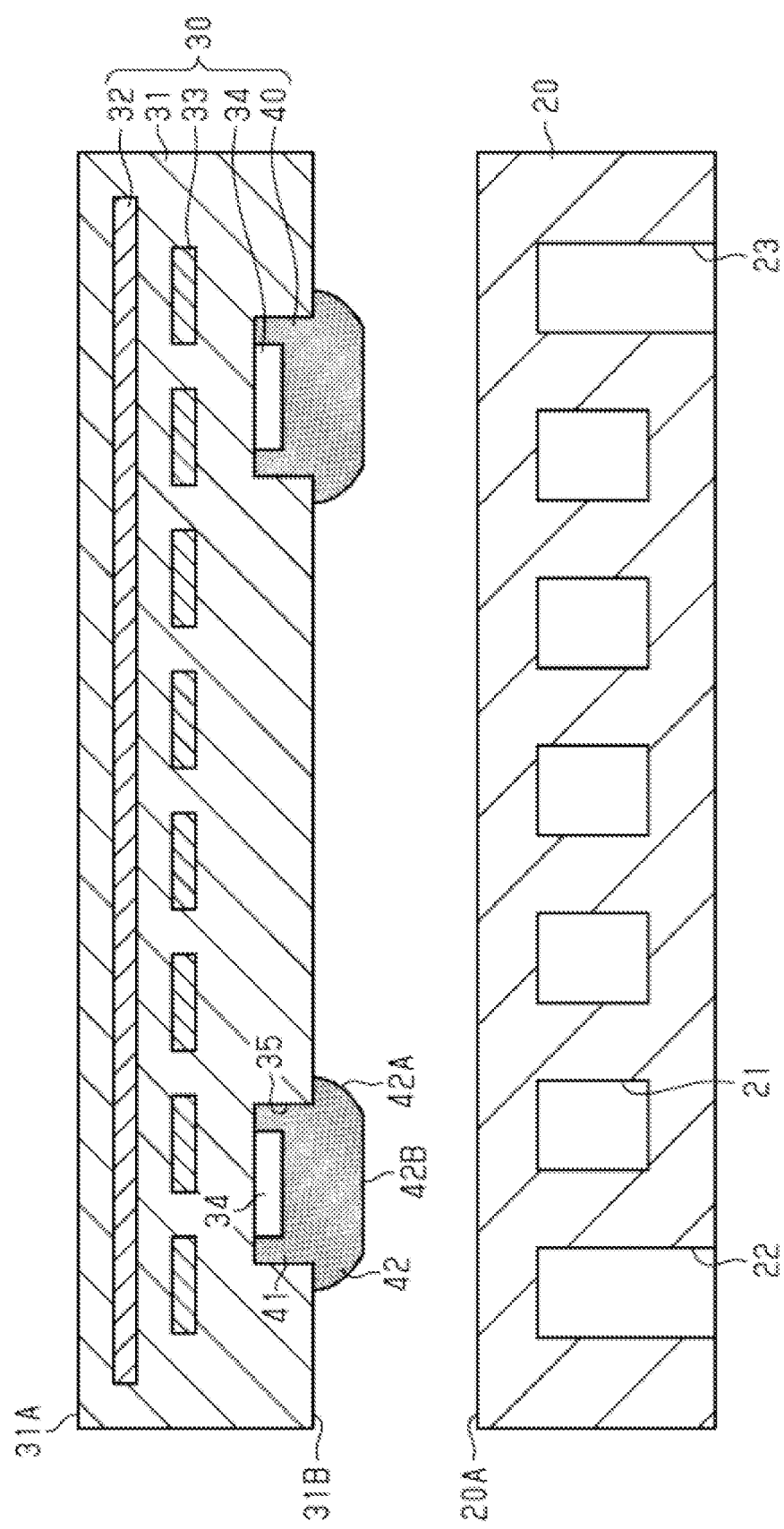
FIG. 10 is a schematic cross-sectional view showing the method for manufacturing a substrate fixing device according to the embodiment.

As shown in FIG. 10, the electrostatic chuck 30 can be manufactured by the manufacturing process described above. In FIG. 10, the electrostatic chuck 30 is shown upside down from that in FIG. 9.

In a step shown in FIG. 10, the base plate 20 in which the cooling path 21 and the like are formed in advance is prepared separately from the electrostatic chuck 30.

Subsequently, in a step shown in FIG. 11, the adhesive layer 50 is formed in a semi-cured state (B-stage) on the first bonding surface 20A of the base plate 20. Next, the electrostatic chuck 30 is disposed on the adhesive layer 50 such that the second bonding surface 31B of the electrostatic chuck 30 faces the adhesive layer 50. In this step, the protruding portion 42 of the resin layer 40 bites into the semi-cured adhesive layer 50. For example, in this step, since the thickness of the adhesive layer 50 is set to be thicker than the thickness of the protruding portion 42, the tip end surface 42B of the protruding portion 42 is not in contact with the first bonding surface 20A of the base plate 20.

Figure 11:
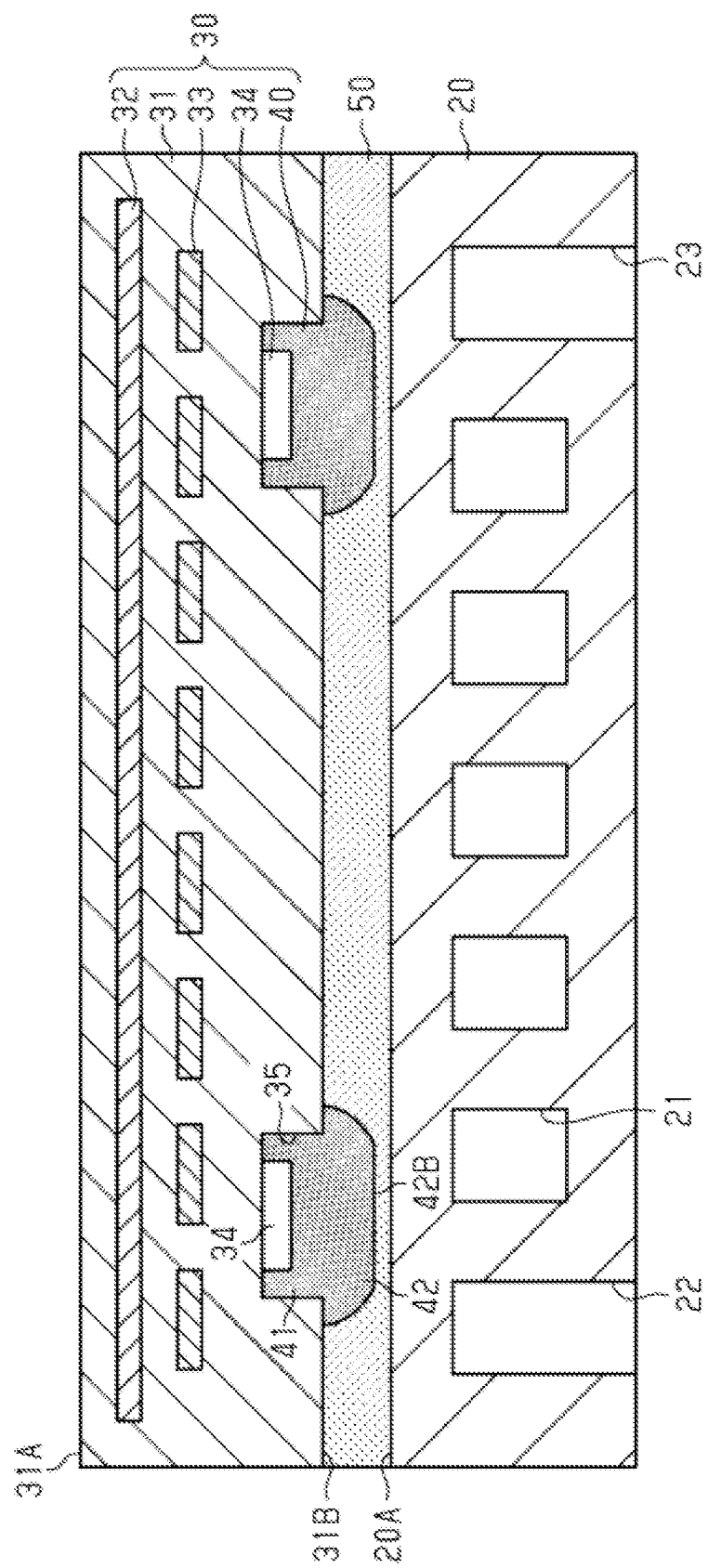
FIG. 11 is a schematic cross-sectional view showing the method for manufacturing a substrate fixing device according to the embodiment.
Figure 12:
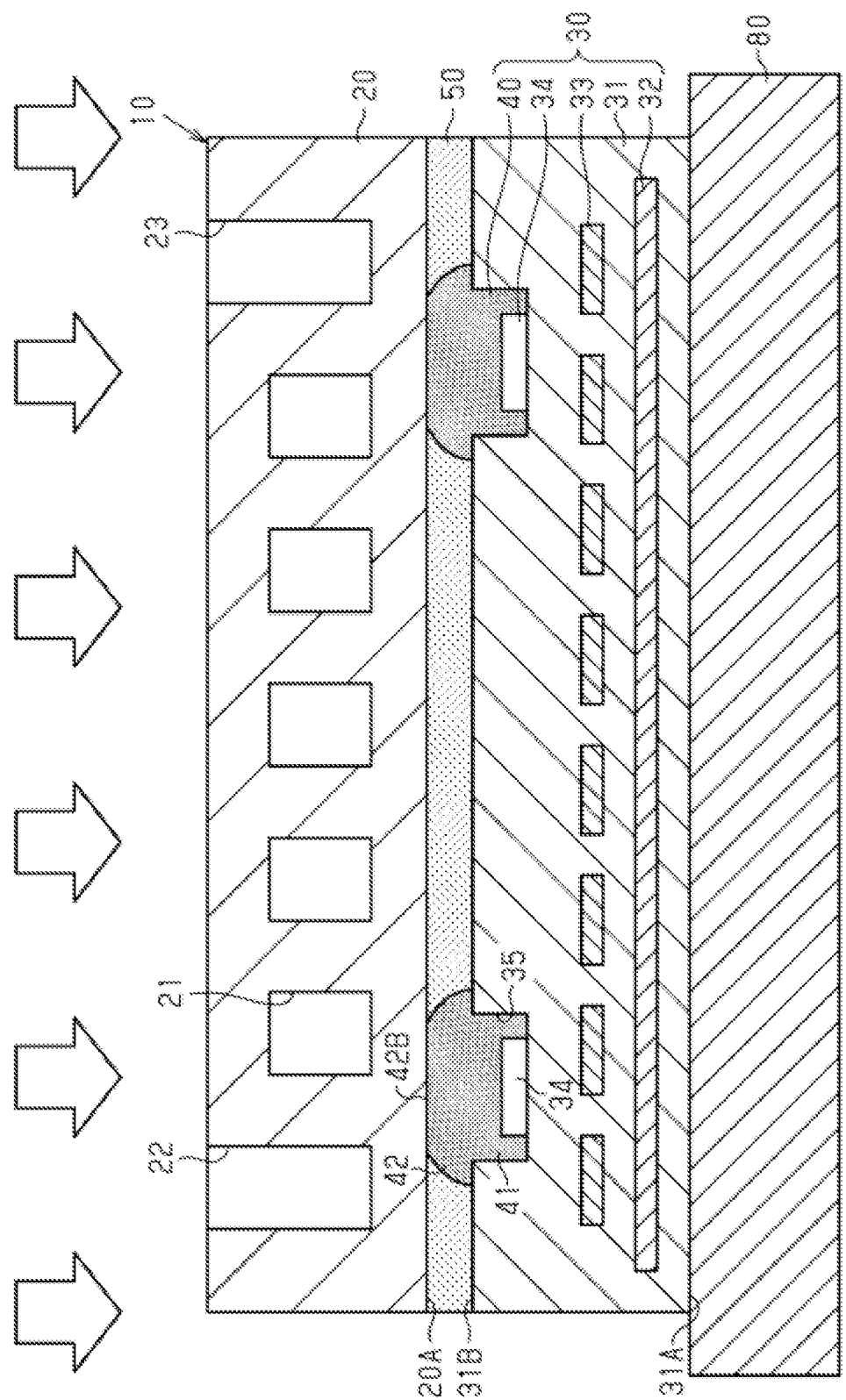
FIG. 12 is a schematic cross-sectional view showing the method for manufacturing a substrate fixing device according to the embodiment.

Next, in a step shown in FIG. 12, the structure shown in FIG. 11 is placed on a surface plate 80. At this time, the structure shown in FIG. 11 is turned upside down, and the structure shown in FIG. 11 is placed on the surface plate 80 such that the substrate placement surface 31A of the electrostatic chuck 30 faces an upper surface of the surface plate 80. Subsequently, while a load is applied to the base plate 20 (see an arrow in the drawing), the adhesive layer 50 is heated to a curing temperature or higher using an oven or the like to be cured. That is, the electrostatic chuck 30 and the base plate 20 are pressed while heating to cure the adhesive layer 50. When the tip end surface 42B of the protruding portion 42 comes into contact with the first bonding surface 20A of the base plate 20 by the pressure applied in this step, the protruding portion 42 functions as the spacer between the electrostatic chuck 30 and the base plate 20. Accordingly, the distance between the first bonding surface 20A of the base plate 20 and the second bonding surface 31B of the electrostatic chuck 30 can be made uniform in a plane perpendicular to a lamination direction of the electrostatic chuck 30 and the base plate 20. Therefore, it is possible to obtain the in-plane uniformity of the thickness of the adhesive layer 50. That is, the thickness of the adhesive layer 50 can be uniform in the plane perpendicular to the lamination direction of the electrostatic chuck 30 and the base plate 20. Accordingly, it is possible to prevent the variation in the temperature of the substrate placement surface 31A of the electrostatic chuck 30 and obtain excellent uniform heat characteristics.

By the above manufacturing process, the substrate fixing device 10 can be manufactured on the surface plate 80.

Figure 13:
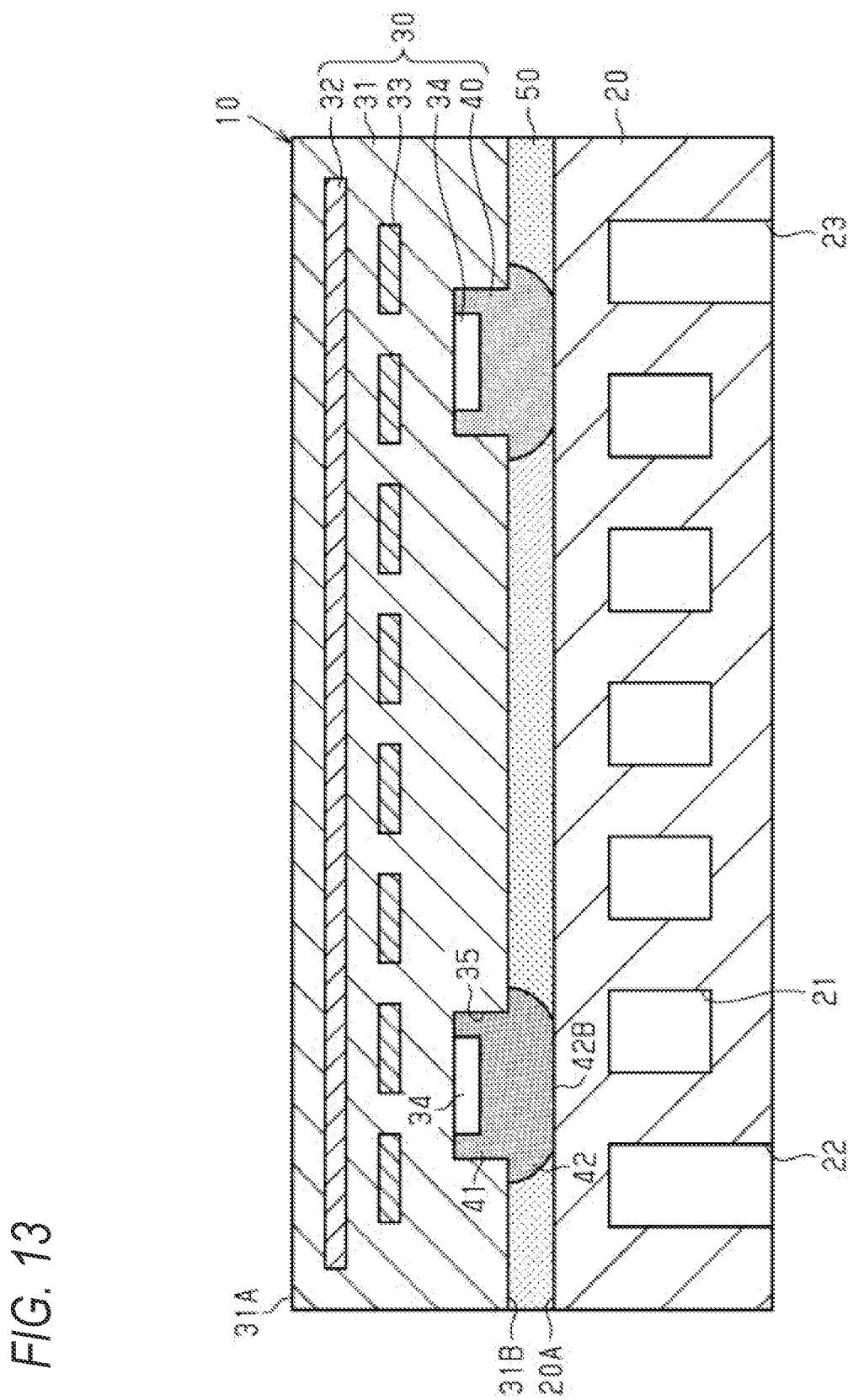
FIG. 13 is a schematic cross-sectional view showing the method for manufacturing a substrate fixing device according to the embodiment.

Thereafter, as shown in FIG. 13, the substrate fixing device 10 is removed from the surface plate 80 shown in FIG. 12, and the substrate fixing device 10 is turned upside down. Accordingly, the substrate fixing device 10 according to the present embodiment can be manufactured.

Next, effects of the present embodiment will be described.

(1) The substrate fixing device 10 includes the base plate 20 having the first bonding surface 20A, and the electrostatic chuck 30 having the substrate placement surface 31A on which the substrate W is placed and the second bonding surface 31B provided on a side opposite to the substrate placement surface 31A, and configured to attract and hold the substrate W. The substrate fixing device 10 includes the adhesive layer 50 configured to bond the first bonding surface 20A of the base plate 20 and the second bonding surface 31B of the electrostatic chuck 30. The electrostatic chuck 30 includes the recess 35 provided in the second bonding surface 31B and the electronic component 34 accommodated in the recess 35. The electrostatic chuck 30 includes the resin layer (layer) 40 including the filling portion 41 configured to fill the recess 35 and the protruding portion 42 protruding from the recess 35 and having the tip end in contact with the first bonding surface 20A. The protruding portion 42 is formed continuously and integrally with the filling portion 41.

According to this configuration, the protruding portion 42 of the resin layer 40 functions as the spacer between the electrostatic chuck 30 and the base plate 20. Accordingly, it is possible to obtain the in-plane uniformity of the thickness of the adhesive layer 50. That is, the thickness of the adhesive layer 50 can be uniform in the plane perpendicular to the lamination direction of the electrostatic chuck 30 and the base plate 20. Accordingly, it is possible to prevent the variation in the temperature on the substrate placement surface 31A of the electrostatic chuck 30 and improve the uniformity of the temperature on the substrate placement surface 31A.

(2) After the resin layer 40 including the filling portion 41 configured to fill the recess 35 in which the electronic component 34 is accommodated and the protruding portion 42 protruding from the recess 35 is formed, the protruding portion 42 is polished so that the protruding portion 42 has a desired thickness. In the substrate fixing device of the related art, the tip end surface of the protruding portion 42 is polished so as to be flush with the second bonding surface 31B of the electrostatic chuck 30. On the other hand, in the substrate fixing device 10 according to the present embodiment, the protruding portion 42 is intentionally left by changing only a polishing amount of the protruding portion 42, and the protruding portion 42 is made to function as a convex structure for controlling the thickness of the adhesive layer 50. Therefore, in the method for manufacturing the substrate fixing device 10 according to the present embodiment, it is possible to suitably prevent an increase in the number of manufacturing steps compared to a method for manufacturing a substrate fixing device of the related art.

(3) The tip end of the protruding portion 42 has the tip end surface 42B formed in a flat surface. According to this configuration, a contact area between the tip end surface 42B of the protruding portion 42 and the first bonding surface 20A of the base plate 20 can be increased. Therefore, the base plate 20 can be stably supported by the protruding portion 42.

(4) The protruding portion 42 has a larger planar shape than the filling portion 41. According to this configuration, compared to a case where the planar shape of the protruding portion 42 is formed to have the same size as the planar shape of the filling portion 41, the base plate 20 can be stably supported by the protruding portion 42.

(5) The side surface 42A of the protruding portion 42 is formed as a curved surface that is curved so as to approach the plane center of the protruding portion 42 from the second bonding surface 31B toward the first bonding surface 20A. According to this configuration, a base end portion of the protruding portion 42 on the second bonding surface 31B side, that is, a portion serving as a base when supporting the base plate 20 can be formed to have a large planar shape. Therefore, the base plate 20 can be stably supported by the protruding portion 42.

Other Embodiments

The above embodiment can be modified as follows. The above-described embodiment and the following modifications can be combined with each other without technical contradiction.

In the above embodiment, one electronic component 34 is accommodated in one recess 35. For example, a plurality of electronic components 34 may be accommodated in one recess 35. At this time, the plurality of electronic components 34 accommodated in one recess 35 may be different types of electronic components.

The number of recesses 35 in the above embodiment is not particularly limited. For example, the number of recesses 35 may be three or five or more.

The number of protruding portions 42 in the above embodiment is not particularly limited. For example, the number of protruding portions 42 may be three or five or more. For example, it is not necessary to provide the protruding portions 42 for all of the plurality of recesses 35. That is, the plurality of resin layers 40 may include the resin layer 40 including only the filling portion 41.

The tip end surface 42B of the protruding portion 42 in the above embodiment is not limited to a flat surface, and may be, for example, a convex curved surface.

The side surface 42A of the protruding portion 42 in the above embodiment is not limited to a curved surface, and may be, for example, a flat surface.

In the resin layer 40 of the above embodiment, the planar shape of the protruding portion 42 is larger than the planar shape of the filling portion 41. For example, the planar shape of the protruding portion 42 may have the same size as the planar shape of the filling portion 41. For example, the planar shape of the protruding portion 42 may be smaller than the planar shape of the filling portion 41.

This disclosure further encompasses various exemplary embodiments, for example, described below.

(1) A method for manufacturing a substrate fixing device, the method comprising:
a step of preparing a base plate having a first bonding surface;
a step of preparing a substrate main body having a substrate placement surface on which a substrate is placed and a second bonding surface provided on a side opposite to the substrate placement surface and including a recess formed in the second bonding surface;
a step of accommodating an electronic component in the recess;
a step of forming a layer having a filling portion configured to fill the recess and a protruding portion protruding from the recess;
a step of disposing an adhesive layer in a semi-cured state and the protruding portion between the second bonding surface of an electrostatic chuck including the substrate main body, the electronic component, and the layer and the first bonding surface of the base plate; and
a step of pressing the electrostatic chuck and the base plate while heating the electrostatic chuck and the base plate to cure the adhesive layer in a state in which a tip end of the protruding portion is in contact with the first bonding surface.

(2) The method for manufacturing a substrate fixing device according to (1),
wherein the protruding portion is formed continuously and integrally with the filling portion.

(3) The method for manufacturing a substrate fixing device according to (1),
wherein the layer is a resin layer.

(4) The method for manufacturing a substrate fixing device according to (1), further comprising.
after the step of forming the layer, a step of polishing the tip end of the protruding portion to form a flat tip end surface at the tip end of the protruding portion.

What is claimed is:

1. A substrate fixing device comprising:
a base plate having a first bonding surface;
an electrostatic chuck having a substrate placement surface on which a substrate is placed and a second bonding surface provided on a side opposite to the substrate placement surface, and configured to attract and hold the substrate; and
an adhesive layer configured to bond the first bonding surface of the base plate and the second bonding surface of the electrostatic chuck,
wherein the electrostatic chuck includes a recess provided in the second bonding surface, an electronic component accommodated in the recess, and a layer including a filling portion configured to fill the recess, and a protruding portion protruding from the recess and having a tip end in contact with the first bonding surface.

2. The substrate fixing device according to claim 1,
wherein the protruding portion is formed continuously and integrally with the filling portion.

3. The substrate fixing device according to claim 1,
wherein the layer is a resin layer.

4. The substrate fixing device according to claim 1,
wherein the end tip of the protruding portion has a flat tip end surface.

5. The substrate fixing device according to claim 4,
wherein the tip end surface is a polished surface.

6. The substrate fixing device according to claim 1,
wherein the protruding portion is formed to have a larger planar shape than the filling portion, and wherein the protruding portion is formed to cover the second bonding surface located at a peripheral edge of the recess.

7. The substrate fixing device according to claim 1,
wherein a side surface of the protruding portion is formed as a curved surface that is curved so as to approach a plane center of the protruding portion from the second bonding surface toward the first bonding surface, and
wherein the adhesive layer covers the entire side surface of the protruding portion.

8. The substrate fixing device according to claim 1,
wherein the electrostatic chuck includes an electrode for attracting the substrate and a heating element for heating the substrate, and
wherein the electronic component is electrically connected to the electrode or the heating element.

9. The substrate fixing device according to claim 1,
wherein the base plate includes a cooling path configured to allow a cooling medium to flow therethrough.

10. The substrate fixing device according to claim 1, further comprising:
a plurality of the protruding portions,
wherein the plurality of protruding portions have the same thickness.

\* \* \* \* \*